(12) United States Patent
Brown et al.

(10) Patent No.: US 6,400,575 B1
(45) Date of Patent: Jun. 4, 2002

(54) INTEGRATED CIRCUITS PACKAGING SYSTEM AND METHOD

(75) Inventors: Sammy K. Brown, Los Gatos; George E. Avery, Saratoga; Andrew K. Wiggin, San Carlos; Samuel W. Beal, Mountain View, all of CA (US)

(73) Assignee: Alpine Microsystems, LLC, Campbell, CA (US)

( * ) Notice: Subject to any disclaimer, the term of this patent is extended or adjusted under 35 U.S.C. 154(b) by 29 days.

(21) Appl. No.: 09/608,446

(22) Filed: Jun. 29, 2000

Related U.S. Application Data

(63) Continuation-in-part of application No. 09/494,334, filed on Jan. 28, 2000, now abandoned, which is a continuation of application No. 08/950,029, filed on Oct. 14, 1997.
(60) Provisional application No. 60/028,905, filed on Oct. 21, 1996.

(51) Int. Cl.[7] .................................................. H05K 1/11
(52) U.S. Cl. ........................ 361/761; 361/764; 361/772; 361/777; 257/700; 257/698
(58) Field of Search ................................ 361/761, 764, 361/772, 777, 763, 774, 783, 790, 803; 174/261, 250, 260; 257/684, 700, 690, 698; 439/68

(56) References Cited

U.S. PATENT DOCUMENTS

| | | | | |
|---|---|---|---|---|
| 4,007,476 A | * | 2/1977 | Hutson | 257/610 |
| 5,048,166 A | * | 9/1991 | Wakamatsu | 29/830 |
| 5,329,423 A | * | 7/1994 | Scholz | 361/760 |
| 5,406,122 A | * | 4/1995 | Wong et al. | 257/753 |
| 5,879,761 A | * | 3/1999 | Kulesza et al. | 427/555 |
| 5,937,320 A | * | 8/1999 | Andricacos et al. | 438/614 |

* cited by examiner

Primary Examiner—Darren Schuberg
Assistant Examiner—David Foster
(74) Attorney, Agent, or Firm—Townsend and Townsend and Crew LLP

(57) ABSTRACT

A plurality of integrated circuits are efficiently interconnected to improve the electrical performance of the overall system. This is accomplished by providing high speed, high density, system level interconnect, including interchip routing lines, on the integrated circuit devices, thereby reducing the routing complexity of the substrate or board. The devices are mounted directly on the board. An integrated circuit device comprises an integrated circuit region including integrated circuit elements. An interconnect layer includes an insulative material, a plurality of conductive traces, and a plurality of conductive bond pads arranged in first and second subsets. A first subgroup of the conductive traces are connected to the integrated circuit elements in the integrated circuit region and are connected to the first subset of conductive bond pads. A second subgroup of the conductive traces are electrically insulated from the integrated circuit elements and are electrically insulated from the first subgroup of the conductive traces to form a pass through. The second subgroup of the conductive traces are connected to the second subset of conductive bond pads.

20 Claims, 6 Drawing Sheets

INTEGRATED CIRCUITS PACKAGING SYSTEM AND METHOD

CROSS-REFERENCES TO RELATED APPLICATIONS

This application is a continuation-in-part application of U.S. patent application Ser. No. 09/494,334, filed Jan. 28, 2000, now abandoned, which is a continuation of U.S. patent application Ser. No. 08/950,029, filed Oct. 14, 1997, which is a nonprovisional application of U.S. Provisional Patent Application No. 60/028,905, filed Oct. 21, 1996, the disclosures of which are incorporated herein by reference.

BACKGROUND OF THE INVENTION

The present invention relates generally to the packaging of semiconductor devices and, more particularly, to interconnecting integrated circuits (ICs) on a substrate.

Electronic systems typically are manufactured from two or more ICs to provide complete system function. Until recently the limitations on performance and the number of I/O pins were not significant to the vast majority of applications. As more devices are integrated in a single IC and as clock speeds increase, however, limitations on performance and the number of I/O pins would be of paramount concern to semiconductor manufacturers. This is because the overall performance of an electronic system based on multiple ICs is a function of the performance of the individual ICs and of the performance of the signals between the ICs. The performance of the signals between the ICs is in turn a function of the number of signals and the electrical characteristics of the mechanism used to connect the I/O pins of the ICs. A more efficient mechanism for interconnecting ICs is therefore becoming an important influence on the cost, size, performance, weight, and efficiency of electronic systems.

Currently, the most common method used for interconnecting ICs is to first package the individual ICs, and then mount the packaged ICs on a substrate such as a printed circuit board. The size of the package is typically several times larger than the IC and is often manufactured from a metal bead frame and protected within a plastic molded case. The packaged ICs are then placed and soldered to a printed circuit board to create a complete electronic system. The advantages of that method include low cost and protection of the ICs during subsequent handling. In addition, the package acts as a standardized carrier for testing of the ICs, such that design changes to the printed circuit board may be made cheaply and quickly. Assembly of the IC to the printed circuit board may further be automated. Finally, such a system allows rework of the printed circuit.

A more efficient method is necessary, however, as advanced ICs require higher performance and a larger number of I/O pins than is possible with conventional interconnect technology. The conventional method has limited electrical performance and limited ability to remove heat. The electrical parasitic characteristics of the package, the length of the conductors, the electrical parasitic capacitance and inductance introduced by the structures of the printed circuit board, and the dielectric material properties used in the printed circuit board all limit the electrical performance of the method. These limitations in turn limit the number of signals on the system to at most a few hundred regardless of the complexity of the IC or the system. Since the current mechanism for IC interconnection has lower performance than the ICs, it limits the overall system performance. Integrated circuits are performing at above 1000 MHz. The current method of interconnecting ICs, however, is limited to systems operating well below 100 MHz.

As an example, current memory devices are limited by I/O constraints of low cost packaging and routing and cost constraints of the next level interconnect, typically glass laminate printed circuit boards. Memory capacity has increased by about 4 times every 3 years such that 256 Mbit (256×1024×1024) is available today, and 1 Gb will likely be available within the next two years. Meanwhile, the data width of memory devices has slowly increased from 1 MHz in the late 1970's to 66 MHz two decades later or about 2 times every 5–6 years. The result is an increase in the time required to "fill" a DRAM or a drop in fill frequency and a limit on the available bandwidth. A semiconductor device can have hundreds of I/O but hundreds of I/O cannot be pinned out in a high volume low cost device such as a DRAM.

SUMMARY OF THE INVENTION

The present invention provides a system and a method for efficiently interconnecting a plurality of ICs to improve the electrical performance of the overall system. This is accomplished by providing high speed, high density, system level interconnect, including interchip routing lines, on the ICs, thereby reducing the routing complexity of the substrate or board on which the ICs are mounted. The technique can be used, for instance, to greatly increase the I/O for a memory component cost effectively such that the fill frequency is dramatically higher (e.g., 10 times or more).

In accordance with an aspect of the present invention, an integrated circuit device comprises an integrated circuit region including integrated circuit elements. An interconnect layer includes an insulative material, a plurality of conductive traces, and a plurality of conductive bond pads arranged in first and second subsets. A first subgroup of the conductive traces are connected to the integrated circuit elements in the integrated circuit region and are connected to the first subset of conductive bond pads. A second subgroup of the conductive traces are electrically insulated from the integrated circuit elements and are electrically insulated from the first subgroup of the conductive traces to form a pass through. The second subgroup of the conductive traces are connected to the second subset of conductive bond pads.

In accordance with another aspect of the invention, an integrated circuit structure comprises an insulative substrate having a plurality of signal traces and a plurality of bond sites disposed thereon. A subgroup of the plurality of signal traces are associated with a subset the plurality of bond sites with each of the signal traces in the subgroup extending from one of the plurality of bond sites in the subset. An integrated circuit device comprises an integrated circuit region including integrated circuit elements, and an interconnect layer. The interconnect layer includes an insulative material, a plurality of conductive traces, and a plurality of conductive bond pads arranged in first and second subsets. A first subgroup of the conductive traces are connected to the integrated circuit elements in the integrated circuit region and are connected to the first subset of conductive bond pads. A second subgroup of the conductive traces are electrically insulated from the integrated circuit elements and are electrically insulated from the first subgroup of the conductive traces to form a pass through. The second subgroup of the conductive traces are connected to the second subset of conductive bond pads. Each of the conductive bond pads of the integrated circuit device is connected with one of the bond sites in the subset.

In accordance with another aspect of the invention, an integrated circuit device comprises an integrated circuit region including integrated circuit elements. A passivation layer is formed on the integrated circuit region. An interconnect layer is formed on the passivation layer. The interconnect layer includes an insulative material, a plurality of conductive traces, and a plurality of conductive bond pads arranged in first and second subsets. A first subgroup of the conductive traces are connected to the integrated circuit elements in the integrated circuit region and are connected to the first subset of conductive bond pads. A second subgroup of the conductive traces are electrically insulated from the integrated circuit elements and are electrically insulated from the first subgroup of the conductive traces to form a pass through. The second subgroup of the conductive traces are connected to the second subset of conductive bond pads.

DESCRIPTION OF THE SPECIFIC EMBODIMENTS

Figure 1:
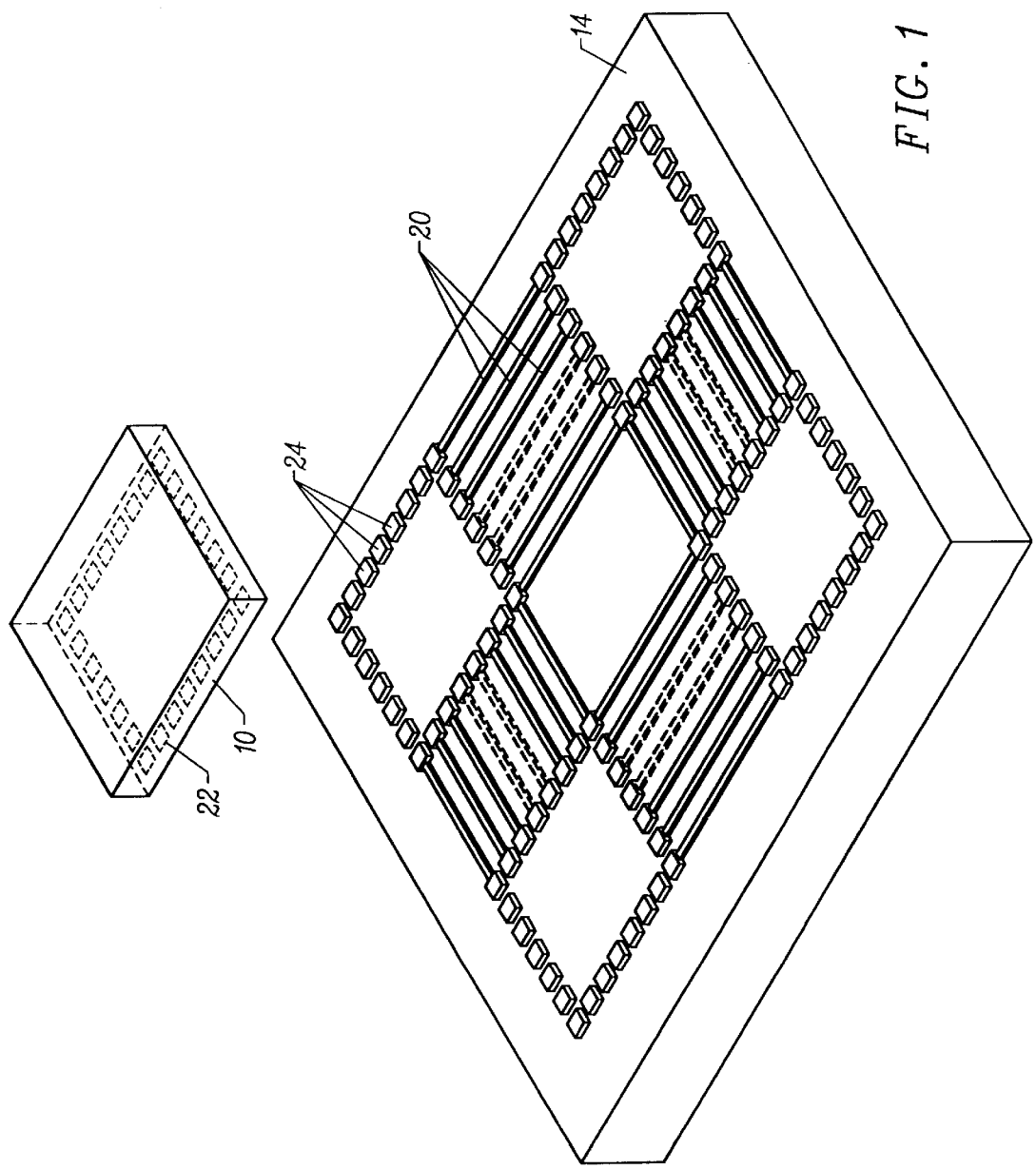
FIG. 1 is an exploded perspective view of a system of efficiently interconnecting ICs on a substrate according to an embodiment of the present invention.

FIG. 1 shows an IC component 10 to be mounted on a substrate or board 14. The IC component 10 desirably is thermally compatible with the board 14. Thermal expansion compensation between the IC component 10 and the board 14 may be accomplished by using compliant materials such as wires to make connections between the IC component 10 and the board 14. Alternatively, bonding materials may be used to limit the stresses. Another method is to make the IC component 10 and the board 14 of materials having similar coefficients of thermal expansion (CTE). Because ICs are typically manufactured from single crystal silicon, which has a relatively low CTE, silicon is a suitable board material. Of course, gallium arsenide or other materials with compatible CTE may also be used.

Figure 2A:
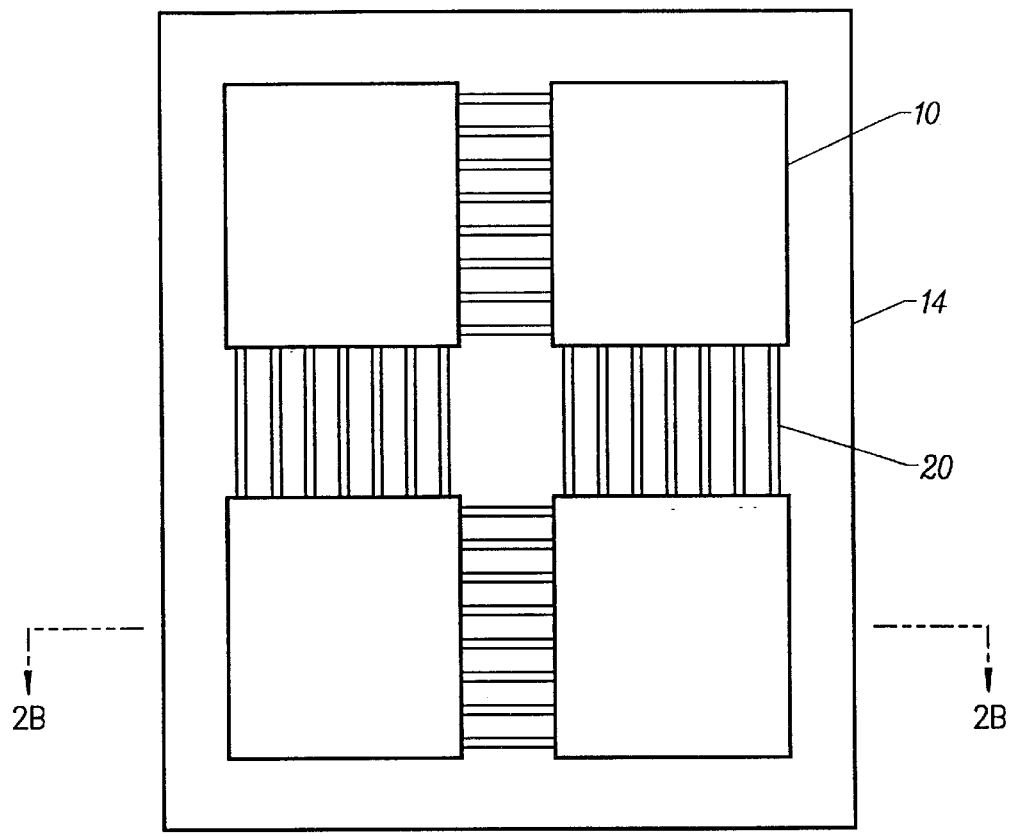
FIG. 2A is a top plan view of the system of FIG. 1.
Figure 2B:
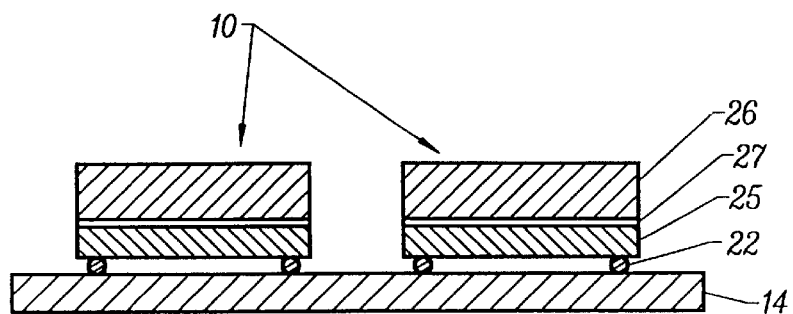
FIG. 2B is an elevational view of the system of FIG. 1.

FIGS. 1 and 2A show interconnections 20 on the board 14. The interconnections 20 are disposed on a generally planar, continuous surface of the board 14 without any holes. The board 14 is typically manufactured employing semiconductor photolithographic processes, such that the routing density of board interconnections 20 on the board 14 is higher than that for conventional board level interconnect. The IC component 10 includes connections 22 that are typically premanufactured to fit the bond pad pattern of connections 24 on the board 14 as seen in FIGS. 1 and 2B. Therefore, the board 14 serves as a mechanical base for the IC components 10 and implements at least a single layer of routing through the interconnections 20 between the IC components 10. Although the figures show connections 22, 24 along the periphery of the IC component 10, the connections 22, 24 may also be provided in other locations (e.g., within the central region) to increase I/O. Because the board 14 does not need a hole for receiving the IC component 10, the locations of the connections 24 are not limited to the periphery around a hole.

Figure 3:
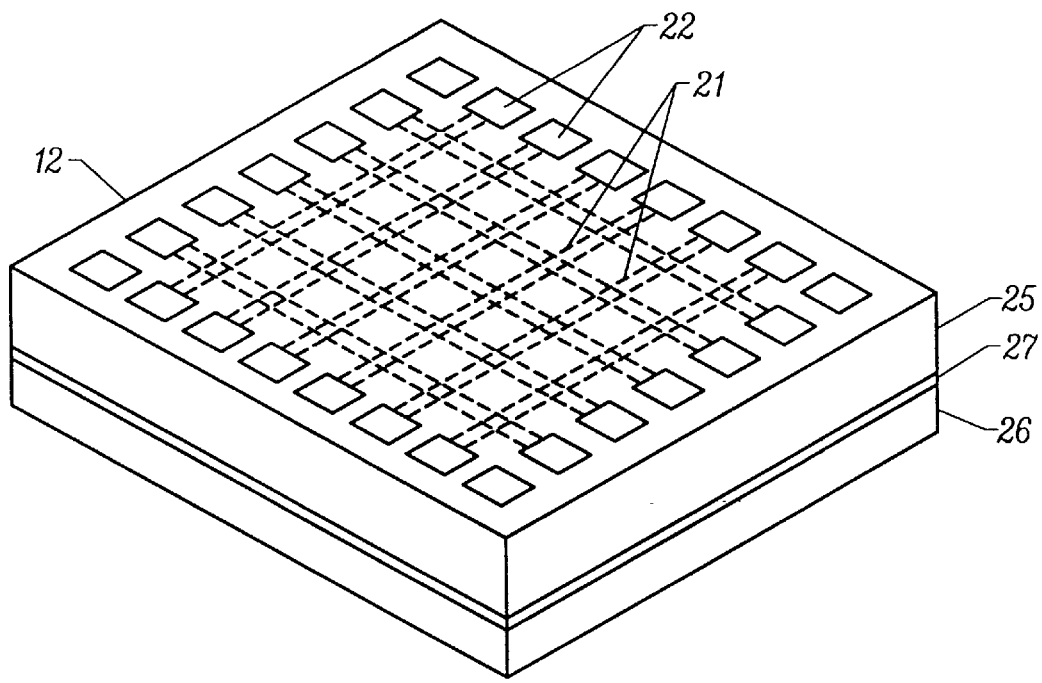
FIG. 3 is a perspective view of an IC component illustrating an example set of electrical connections.

As shown in FIGS. 2B and 3, the interconnections 22 on the IC component 10 are formed on a region referred as the "virtual micropallet region" or "interconnect layer" 25, which is formed on the IC region 26 that includes the integrated circuit elements. As used herein, integrated circuit elements are used to refer to electronic circuitry or functional elements of the IC itself, such as CMOS, bipolar Si, and GaAs (as opposed to interconnect). The interconnect layer 25 and the board 14 desirably have similar coefficients of thermal expansion (CTE). In a specific embodiment, the interconnect layer 25 and the board 14 are made of the same material (e.g., silicon).

Figure 3A:
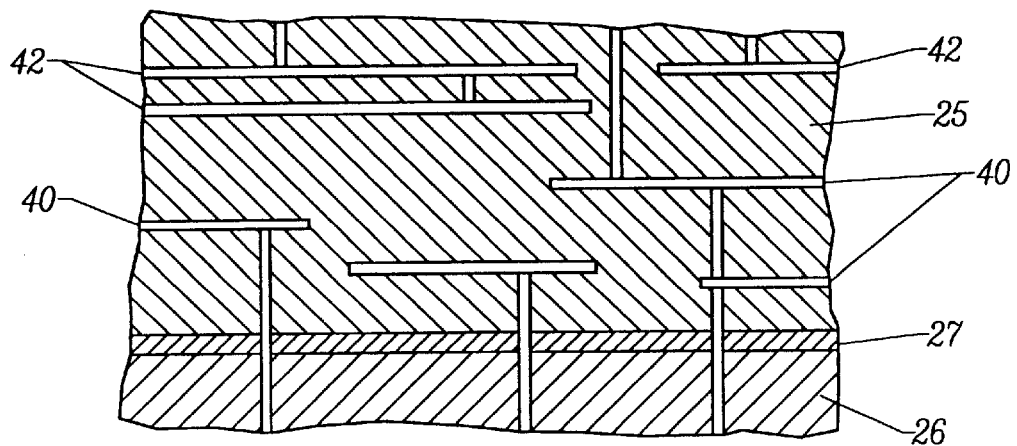
FIG. 3A is a cross-sectional view of the IC component of FIG. 3.

As shown in FIGS. 2B and 3A, passivation layer 27 is desirably formed between the IC region 26 and the interconnect layer 25. The interconnect layer 25 includes dielectric layers and metal lines. A first subgroup of conductive or metal lines 40 are connected to the IC elements in the IC region 26, while a second subgroup of metal lines 42 are insulated from the IC elements and from the metal lines 40. Those metal lines 42 are configured to support system level interconnect architecture and for routing in the interconnect layer 25. The first subgroup of metal lines 40 are connected to a first subset of connections 22 of the IC component 10 (with vias as crossovers between metal lines 40), while the second subgroup of metal lines 42 are connected to a second subset of connections 22 of the IC component 10 (with vias as crossovers between metal lines 42). In one example, the interconnect layer 25 has a thickness of about 15–20 $\mu$m with multiple metal lines that are each about 3–5 $\mu$m thick. The system routing lines in the interconnect layer 25 may be disposed quite close to the IC region 26 (e.g., spaced by only about 1 $\mu$m).

The passivation layer 27 and interconnect layer 25 are formed on an IC wafer after the IC elements of the IC region 26 have been formed on the IC wafer. The dielectric layers may be silicon oxide or the like. In a specific embodiment, the metal lines are formed by copper processing (e.g., by evaporation or electroplating), which has the benefits of low cost and high yield. Copper has a higher conductivity than aluminum, and provides better electromigration failure protection than aluminum. The passivation layer 27 desirably isolates and protects the IC region 26 from moisture. The passivation layer 27 also provides stress relief for the IC region 26 as the IC component 10 is being mounted directly to the board 14. The passivation layer 27 may also serve to block copper migration. In a specific embodiment, the passivation layer 27 is formed by spinon BCB which is a dielectric chemical available from Dow Chemical. Any suitable processes for forming the passivation layer 27 and interconnect layer 25 may be used.

In specific embodiments, there are no vias in the board 14, and the IC interconnections are distributed among the IC components 10 by allowing signals between the IC components to be passed through the IC components. The IC component 10 contains routing lines referred to as pass throughs that are not directly related to the IC itself. Because the interchip routing is distributed across the individual IC components 10, the routing complexity of the board 14 is reduced to single node sets. Compared to a single interconnection board, the interconnection distributions among the IC components 10 greatly simplify the interconnection task, and significantly improve the overall system performance. In such an embodiment, all of the signal connections lie on a plane. This configuration is advantageous since the chemical properties of silicon are such that it may be impractical to form plated vias through silicon materials thicker than a few tenths of a micron. By using the same materials for the IC component 10 and the board 14, direct solder connections may be made between the IC component 10 and the board 14. Of course, the board 14 in other embodiments may include multiple levels of interconnect, for example, in applications where the yield is not critical. In such applications, there would be vias in the board 14 as the interconnections would include pass throughs as well as crossovers.

As seen in FIG. 2B, the IC component 10 is typically pre-manufactured with solder bumps (shown as connections 22) which are placed in arrays to fit the bond pad patterns of connections 24 on the board 14. The advantage of using solder bumps to connect the IC component 10 to the board 14 is that an area array may be used to maximize the number of external signal connections available. In addition, parasitics associated with wire bonding may be eliminated. Solder bump bonding is an automated process, and bumping cost is independent of pin count. Hence, the use of solder bumps also enables integration of higher I/O pin counts while keeping cost low. It is noted that the use of solder is one way to make bumps, but other methods are possible (e.g., the use of gold).

FIG. 3 shows an exemplary electrical interconnection configuration on the IC component 10. For simplicity, a relatively small number of connections are shown. The IC component 10 has connections 22 along its peripherals and routing lines 21 which are typically embedded interconnections for routing between the connections 22. The routing lines 21 include signal paths that are not directly related to the IC itself, but are independent signal paths that serve as pass throughs for signals from a neighbor IC component to other neighboring IC components. In this way, interconnection of the IC components is distributed across the individual IC components.

The connections 22 are predetermined according to the application of the particular IC components. Because the connections 22 are manufactured using semiconductor photolithography techniques, the resulting routing density is similar to the density of on-chip interconnect. The number of connections between IC components, known as external interconnect, generally requires significantly less interconnect density than the interconnect density used to connect transistors on the IC. Hence, the external interconnection density can be made high enough by using the same or less advanced semiconductor process used to fabricate the IC. Using this same technique, the external interconnections may also be made to fit into an area that is the same or less than the area of the IC. This provides a significant yield advantage over the current method as the size and area of printed circuit boards are generally many times larger than the IC components.

The IC component 10 is manufactured from a multi-level semiconductor metallization process. Crossovers between signal paths are achieved through the use of vias, which are located within the same layer. Because all the vias are in the same layer, custom changes to connections 22 may be made easily at the manufacturing level by single-mask programming. For each new application, the location of the vias may be determined according to the particular IC interconnections desired. Once the locations of the vias have been determined, only the via-containing layer needs to be changed.

Figure 4:
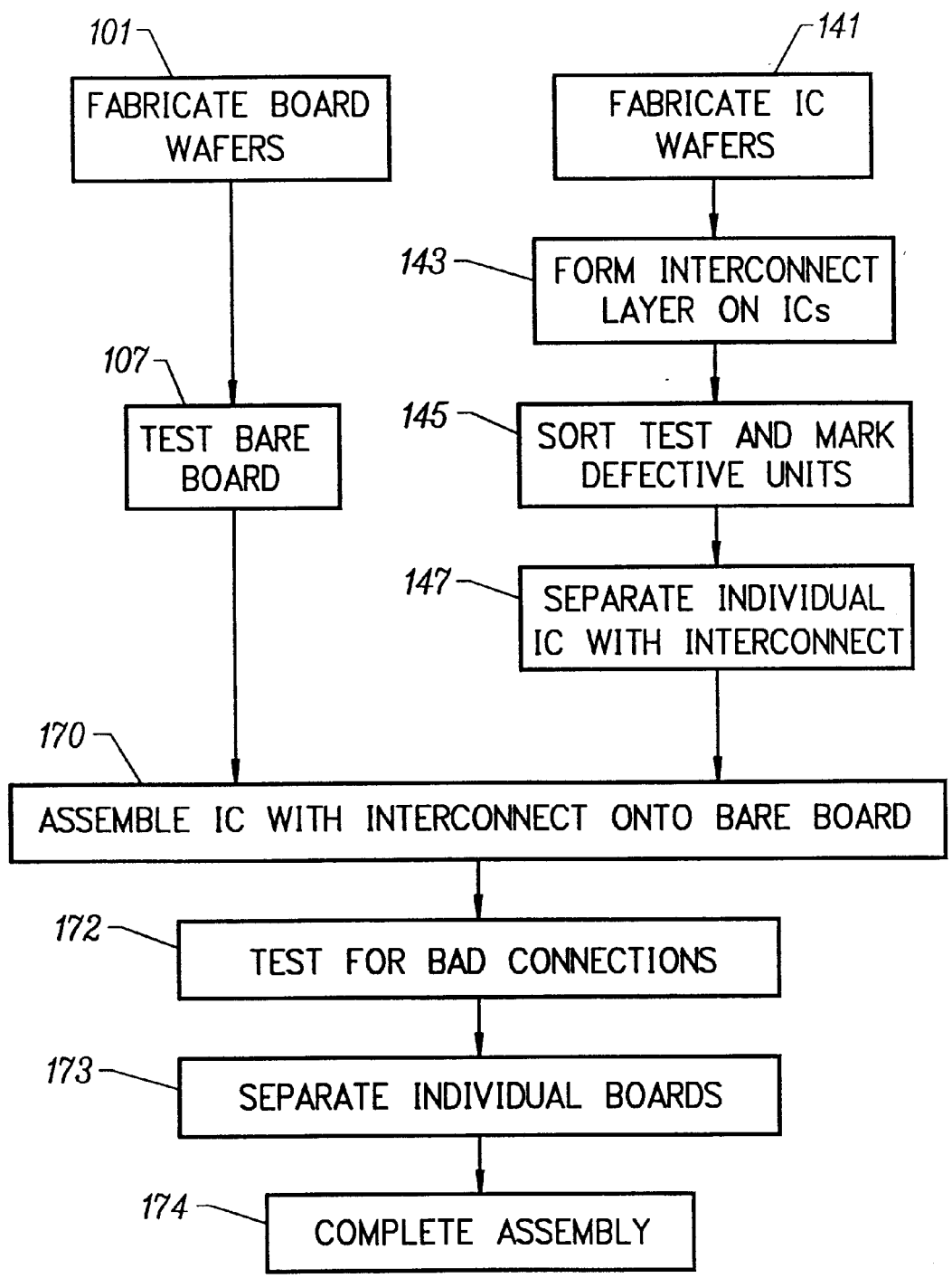
FIG. 4 is a flowchart showing a specific method of interconnecting ICs according to an embodiment of the invention.

FIG. 4 is a flowchart showing a specific method of interconnecting IC components. For each complex IC, the board wafers and IC wafers are separately manufactured. After the board wafers are fabricated (step 101), they are tested (step 107). Similarly, the IC wafers are fabricated (step 141), and the interconnect layers are formed (step 143). The IC wafers are tested and sorted for defective units (step 145). Defective units are discarded, and good units are separated into individual IC components in step 147. In an alternative embodiment, the IC wafers may be separated first and then tested. In step 170, the IC components are assembled onto the bare board. The assembly is tested for bad connections at step 172 and the individual boards are separated at step 173. The assembly is completed at step 174.

The benefits of having system level interconnect on the IC component allow a much higher routing density requirement to be implemented with thin film processing directly on a functional wafer, thereby eliminating high density routing on the next level interconnect. The next level interconnect, typically a glass laminate printed circuit board, is large and processed with mechanical dimensions on the order of 5.0 mils (>100 microns) so that high density routing must be partitioned into multiple routing layers. This increases the cost of the board and, for some applications, decreases the performance of the system caused by, for example, signal degradation due to parasitic capacitance, inductance of vias, partial ground/power planes varying impedance, and the like. Embodiments of the present invention provide system level interconnect on the IC components, desirably using materials that are compatible with IC wafer processing and serve to protect the IC instead of degrading the yield or quality of the IC or the board.

The present interconnect technique does not require mounting the ICs onto carriers for flip mounting on the board. It also eliminates formation of holes on the board. This permits the use of materials for the board that may be difficult to cut to form holes in the board including, for example, glass, flexible laminate structures, and the like. Because no holes are required in the board for receiving the IC components, the IC components can be mounted closer to each other (even abutting each other) without the same concerns over the mechanical strength and stability of boards with holes, thereby reducing the area of the board needed.

Figure 5:
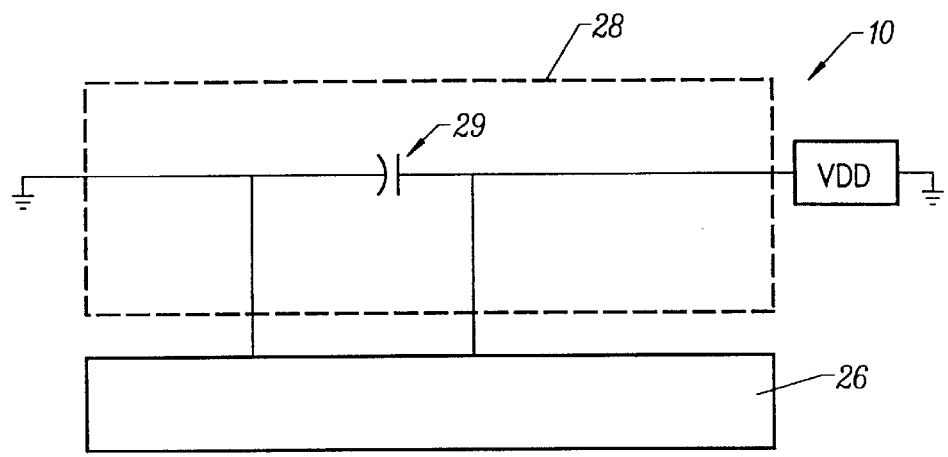
FIG. 5 is a schematic view of an IC component illustrating a specific embodiment of the invention.

Addition layers can be formed on the IC region 26 for various purposes. For instance, capacitors or resistors can be provided in additional layers and connected to the IC region 26 to reduce or eliminate the need to provide discrete capacitors and resistors within the IC region 26. FIG. 5 shows a functional layer 28 having a bypass capacitor 29 connected to the IC region 26 and a VDD (voltage supply) 30. The use of the functional layer 28 provides a greater degree of flexibility when producing the IC region 26 that can result in a per-unit-price-reduction. For example, considering the vast quantity of devices on a typical IC, the minimum feature dimension is on the order of 0.25 micrometer. There are often, however, devices associated with an IC that need not be scaled to have a minimum feature dimension on the order of 0.25 micrometer. These devices may be made with much larger feature dimensions (e.g., on the order of 1 micrometer) and placed in the functional layer 28. Examples of such devices include a clock distribution network, a power distribution network with a temperature sensor, and embedded RLC circuitry. In some embodiments, additional layers may include power and ground planes that are connected to and complement the power and ground planes within the IC region 26.

Figure 6:
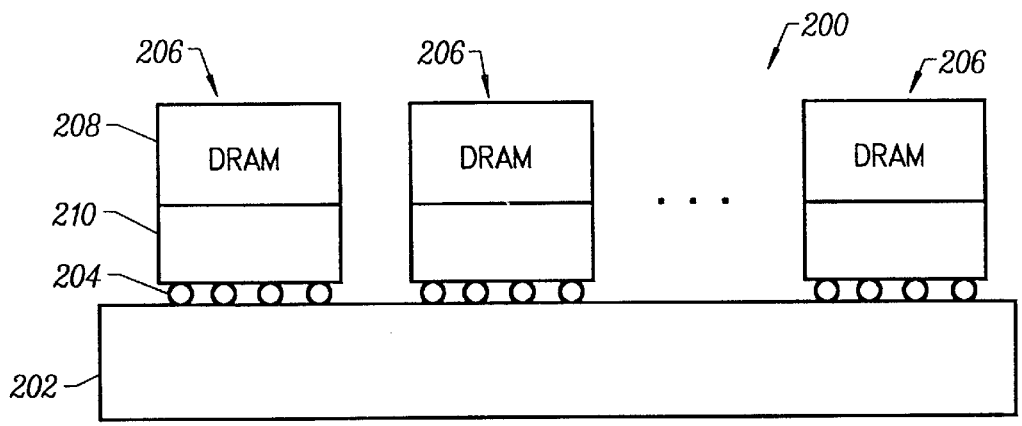
FIG. 6 is an elevational view illustrating a memory module formed by a method of the present invention.

In FIG. 6, a single inline memory module 200 includes a board 202 and a plurality of bumps or connections 204 connecting a plurality of IC components 206 to the board 202. Each IC component 206 includes a DRAM 208 and an interconnect region 210 which typically includes a passivation layer and an interconnect layer as discussed above (FIGS. 1 and 3). In specific embodiments, the board 202 may be a silicon or glass laminate printed circuit board with copper planes for power distribution and copper traces for signals. The board 202 may be made of other similar materials. The structure of the memory module 200 facilitates side-by-side placement or direct abutment of the IC components 206. Connections between the IC components 206 are made in a single layer on the board 202, except for power and ground connections which are made through a via to power and ground planes.

Figure 7:
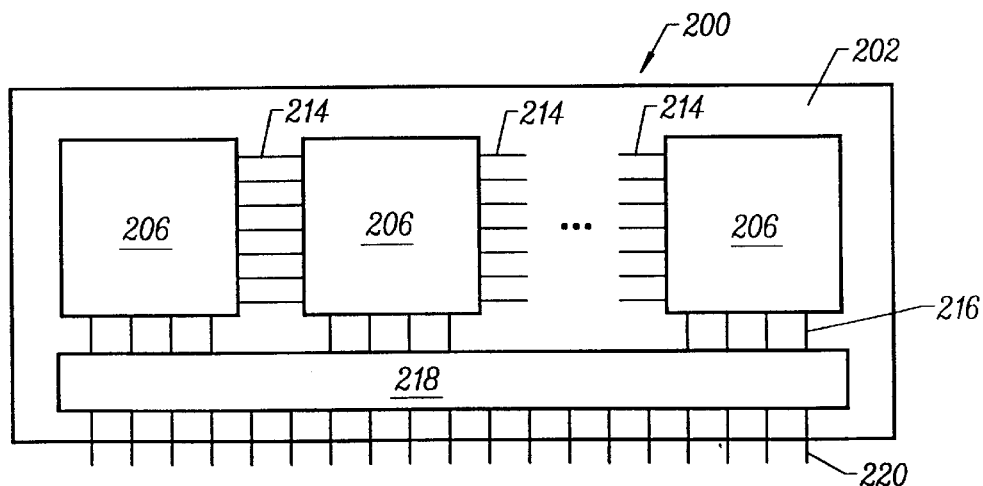
FIG. 7 is a top plan view of the memory module of FIG. 6.
Figure 8A:
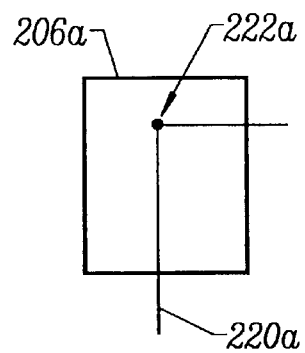
FIGS. 8A–8C illustrate an example of the routing of the address and control signals in the memory module of FIG. 6.
Figure 8B:
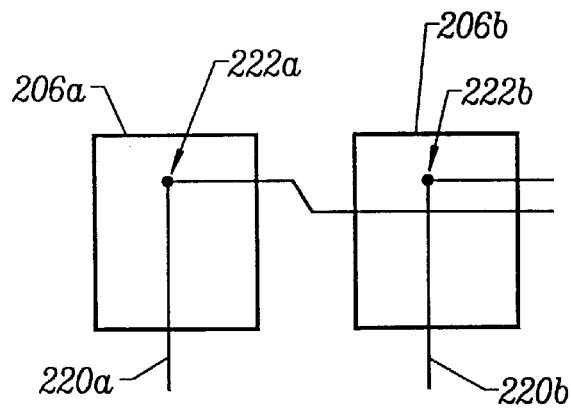
Figure 8C:
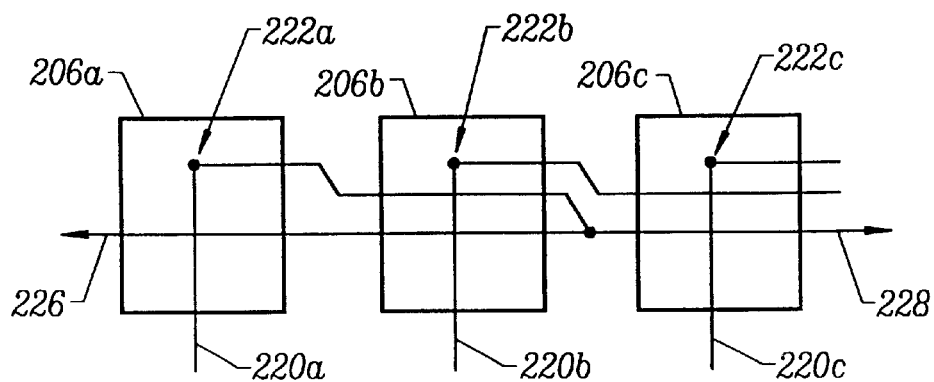

As shown in the top plan view of FIG. 7, all of the address and control signals flow from one end of the module 200 to the other end routing through each IC component 206 by interconnections 214 to connect in parallel common signals or to connect selectively to individual components. Data signals flow out of the IC components 206 through interconnections 216 to an edge connector 218 which is provided with interconnections 220. FIGS. 8A–8C illustrate an example of the routing of the address and control signals in the module 200. A subset of the address and control signals enter the interconnect layers 210 of the IC components 206 from the bottom through the bumps 204, and are redistributed to the sides through the edge connector 218. The benefit is that no vias are required in the board 202 to connect the ICs 208, thereby improving size, performance, etc. For instance, FIG. 8A shows a subset of signal lines 220a connecting to a portion 222a of a bus at the first IC component 206a. FIG. 8B shows another subset of signal lines 220b connecting to another portion 222b of the bus at the second IC component 206b. The routing is jogged or offset in the board 202 so that new signals from subsequent components can be uniquely added to the bus. FIG. 8C shows the next subset of signal lines 220c connecting to the next portion 222c of the bus at the third IC component 206c. The bus may route in either direction indicated by the arrows 226, 228.

The above-described arrangements of apparatus and methods are merely illustrative of applications of the principles of this invention and many other embodiments and modifications may be made without departing from the spirit and scope of the invention as defined in the claims. For instance, different arrangements of connections and interconnections may be used. Other ways of manufacturing the IC components may be employed. The scope of the invention should, therefore, be determined not with reference to the above description, but instead should be determined with reference to the appended claims along with their full scope of equivalents.

What is claimed is:

1. An integrated circuit device comprising:
   an integrated circuit region including integrated circuit elements; and
   an interconnect layer including an insulative material, a plurality of conductive traces, and a plurality of conductive bond pads arranged in first and second subsets, a first subgroup of the conductive traces being connected to the integrated circuit elements in the integrated circuit region and being connected to the first subset of conductive bond pads, a second subgroup of the conductive traces being electrically insulated from the integrated circuit elements and being electrically insulated from the first subgroup of the conductive traces to form a pass through, the second subgroup of the conductive traces being connected to the second subset of conductive bond pads.

2. The integrated circuit device of claim 1 further comprising a passivation layer disposed between the integrated circuit region and the interconnect layer.

3. The integrated circuit device of claim 2 wherein the passivation layer is formed on the integrated circuit region.

4. The integrated circuit device of claim 3 wherein the conductive traces in the interconnect layer comprise copper and the passivation layer comprises a material that substantially blocks copper migration.

5. The integrated circuit device of claim 3 wherein the interconnect layer is formed on the passivation layer.

6. The integrated circuit device of claim 1 further comprising a functional layer including at least one electronic device formed therein and in electrical communication with the integrated circuit elements in the integrated circuit region.

7. The integrated circuit device of claim 6 wherein the electronic device comprises a capacitor.

8. The integrated circuit device of claim 1 wherein each of the plurality of conductive bond pads includes a solder bump attached thereto.

9. The integrated circuit device of claim 1 wherein the integrated circuit region and the interconnect layer have substantially matching coefficients of thermal expansion.

10. An integrated circuit structure comprising:
    an insulative substrate having a plurality of signal traces and a plurality of bond sites disposed thereon, a subgroup of the plurality of signal traces being associated with a subset the plurality of bond sites with each of the signal traces in the subgroup extending from one of the plurality of bond sites in the subset;
    an integrated circuit device comprising an integrated circuit region including integrated circuit elements, and an interconnect layer, the interconnect layer including an insulative material, a plurality of conductive traces, and a plurality of conductive bond pads arranged in first and second subsets, a first subgroup of the conductive traces being connected to the integrated circuit elements in the integrated circuit region and being connected to the first subset of conductive bond pads, a second subgroup of the conductive traces being electrically insulated from the integrated circuit elements and being electrically insulated from the first subgroup of the conductive traces to form a pass through, the second subgroup of the conductive traces being connected to the second subset of conductive bond pads, wherein each of the conductive bond pads of the integrated circuit device is connected with one of the bond sites in the subset.

11. The integrated circuit structure of claim 10 wherein the subset of bond sites are disposed on a generally planar, continuous surface of the insulative substrate.

12. The integrated circuit structure of claim 10 wherein the insulative substrate comprises a glass laminate.

13. The integrated circuit structure of claim 10 wherein the interconnect layer of the integrated circuit device and the insulative substrate have substantially matching coefficients of thermal expansion.

14. The integrated circuit structure of claim 10 wherein the interconnect layer of the integrated circuit device and the insulative substrate comprise silicon.

15. The integrated circuit structure of claim 10 wherein the integrated circuit device further comprises a passivation layer disposed between the integrated circuit region and the interconnect layer.

16. The integrated circuit structure of claim 15 wherein the passivation layer is formed on the integrated circuit region.

17. The integrated circuit structure of claim 15 wherein the interconnect layer is formed on the passivation layer.

18. An integrated circuit device comprising:
   an integrated circuit region including integrated circuit elements;
   a passivation layer formed on the integrated circuit region; and
   an interconnect layer formed on the passivation layer, the interconnect layer including an insulative material, a plurality of conductive traces, and a plurality of conductive bond pads arranged in first and second subsets, a first subgroup of the conductive traces being connected to the integrated circuit elements in the integrated circuit region and being connected to the first subset of conductive bond pads, a second subgroup of the conductive traces being electrically insulated from the integrated circuit elements and being electrically insulated from the first subgroup of the conductive traces to form a pass through, the second subgroup of the conductive traces being connected to the second subset of conductive bond pads.

19. The integrated circuit device of claim 18 further comprising a functional layer formed between the interconnect layer and integrated circuit region, the functional layer including at least one electronic device formed therein and in electrical communication with the integrated circuit elements in the integrated circuit region.

20. The integrated circuit device of claim 18 wherein the integrated circuit region, the passivation layer, and the interconnect layer have substantially matching coefficients of thermal expansion.

* * * * *